(12) United States Patent
Harn

(10) Patent No.: US 7,137,093 B2
(45) Date of Patent: Nov. 14, 2006

(54) POST-PLACEMENT TIMING OPTIMIZATION OF IC LAYOUT

(75) Inventor: Ywh-Pyng Harn, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 517 days.

(21) Appl. No.: 10/637,423

(22) Filed: Aug. 8, 2003

(65) Prior Publication Data

US 2005/0034091 A1 Feb. 10, 2005

(51) Int. Cl.
*G06F 17/50* (2006.01)
(52) U.S. Cl. ............................................. 716/10; 716/9
(58) Field of Classification Search ............... 716/8–14
See application file for complete search history.

(56) References Cited

U.S. PATENT DOCUMENTS

| 5,397,749 | A | * | 3/1995 | Igarashi | 716/8 |
| 5,880,967 | A | * | 3/1999 | Jyu et al. | 716/6 |
| 6,272,668 | B1 | * | 8/2001 | Teene | 716/10 |
| 6,532,577 | B1 | * | 3/2003 | Mbouombouo et al. | 716/6 |
| 6,865,726 | B1 | * | 3/2005 | Igusa et al. | 716/18 |

OTHER PUBLICATIONS

R. Fletcher, *Practical Methods of Optimization Second Edition*, John Wiley & Sons, reprinted Mar. 1991, chapter 12.

* cited by examiner

*Primary Examiner*—Thuan Do
*Assistant Examiner*—Binh Tat
(74) *Attorney, Agent, or Firm*—Rosenberg, Klein & Lee

(57) ABSTRACT

When an IC layout is to include time-constrained signal paths, a placement plan defining positions of cells forming the IC is analyzed to estimate lengths of nets needed to interconnect the cells based on the positions of cells included in those signal paths. A capacitance and resistance of each net is then estimated based on its estimated length. The delay through each time-constrained signal path is then estimated based on the estimated capacitance and resistance of each net to be included in the time-constrained signal path and on the terminal impedances, switching speeds and driving strengths of the cells included in the signal path. The estimated path delay for each signal path is then compared to its timing constraint to determine whether that signal path is a "critical signal path" likely to fail to meet its timing constraint following development of a detailed routing plan. A non-linear programming technique is then employed to determine how, with minimal disturbance to the placement plan, to reposition cells forming the critical paths so that when the nets are routed between the cells, all critical paths will be more likely to satisfy their timing constraints.

29 Claims, 3 Drawing Sheets

POST-PLACEMENT TIMING OPTIMIZATION OF IC LAYOUT

BACKGROUND OF THE INVENTION

1. Field of the Invention

The invention relates in general to methods for generating integrated circuit (IC) placement and routing plans, and in particular to a computer-aided method for optimizing a placement plan to improve the likelihood that a routing plan based on the placement plan will satisfy all timing constraints.

2. Description of Related Art

An IC designer typically generates a hardware description language (HDL) netlist describing an IC in terms of the logical relations between the various IC input, output and internal signals to be conveyed by conductive networks ("nets") to be formed within the IC. After creating the HDL netlist, the designer uses synthesis tools to convert the HDL netlist into a gate level netlist describing the IC as being formed by a set of instances of logic gates and other types of IC components for implementing the logic described by the HDL netlist. The gate level netlist indirectly describes each IC component by referring to it as an instance of a standard component (or "cell") of that type described by an entry for that cell in a cell library, a database including a separate entry for each type of cell that a designer can incorporate into an IC. The cell library entry for each kind of cell provides information about that cell including, for example, its impedance characteristics and a description of the cell layout.

After using a synthesis tool to generate a gate level netlist, the designer typically uses placement and routing tools to generate an IC layout file including a placement plan indicating the position of each cell within the IC and a routing plan specifying the routing of the nets. The nets include conductors formed on one or more layers of the IC and vias extending between layers, and they may include buffers for amplifying signals as they travel between cells.

Most digital ICs employ register transfer logic wherein various synchronous logic blocks communicate with one another through latches, registers or other clocked devices. When a logic block receives its input signals and transmits its output signals through registers, state changes in its input and output signals can only occur at times coinciding with edges of the clock signals that clock its input and output registers. This makes the timing of signal edges passing between synchronous logic blocks highly predictable, thereby simplifying the task of coordinating their communications.

FIG. 1 illustrates a synchronous logic block including a set of gate G1–G8 receiving input signals for a latch L1 clocked by a clock signal CLK1 and transmitting its output signal through an output latch L2 clocked by a clock signal CLK2. Clock signals CLK1 and CLK2 will often be of similar frequency but of differing phase such that clock signal CLK2 will clock latch L2 with some predictable delay after an edge of CLK1 clocks latch L1. A "signal path" within an integrated circuit (IC) is a set of conductors and/or logic gates logically interconnecting two nodes. For example, a state change at a node A1 at the output of latch L1 occurring in response to an edge of clock signal CLK1 can cause a state change in signals at any of nodes A2–A4 at the inputs of latch L2. Thus, several signal paths connect node A1 to nodes A2–A4. More than one signal path can interconnect two nodes. For example, the following two signal paths link node A1 to node A3:

(nets N1, N2, N3, N4 and N5, gates G1, G2 G4, G7, and latch L2)

(nets N1, N2, N6, N4 and N5, gates G1, G3 G4, G7, and latch L2).

An IC designer will normally want the path delay through each signal path between any output of latch L1 and any input of latch L2 to be less than the period between edges of clock signals CLK1 and CLK2 so that after a CLK1 signal edge allows signals at the inputs of gates G1, G2, G5 and G8 to change state, all inputs to latch L2 will settle to their steady-state logic levels before the next CLK2 signal edge. The period between edges of the CLK1 and CLK2 signals therefore constitutes a "timing constraint" on every signal path between any output of latch L1 and any input of latch L2. The designer will typically employ a timing analysis tool to check an IC layout to determine whether all time-constrained paths will meet their timing constraints.

The delay through a signal path between any two nodes is the sum of the switching delays through all of the gates in the path and of the delays through the various nets included in the path. A computer-aided timing analysis tool can estimate the switching delay through each cell and the propagation delay through each section of a net in a signal path from the cell library description of that type of cell, from the resistance and capacitance of that net section and from the capacitance of any cell terminals that may be connected to that net section. The cell library tells the timing analysis tool the capacitance at each cell terminal, but since the resistance and capacitance of each conductor forming a section of a net depends on the dimensions of the conductor, the conductor's position with respect to other conductors, and the dielectric constant of the materials surrounding the conductor, a designer will typically employ a computer-aided resistance/capacitance (RC) extraction tool to process an IC layout to determine the resistance and capacitance of each conductor included in a net to provide the timing analysis tool with the impedance information it needs regarding the conductors included in each signal path to estimate the delay through the signal path.

When timing analysis shows that a layout fails to satisfy timing constraints on some signal paths, the designer may have to modify the layout to reduce path delays in those signal paths. In some cases, the designer may find it necessary to modify the cells forming the IC or modify the IC logic to eliminate timing constraints that are too difficult to satisfy. The placement and routing process can therefore be highly iterative and time-consuming, particularly when many signal paths are tightly constrained.

A typical placement algorithm tries to place interconnected cells close to one another to minimize path distances between them and to reduce routing congestion. Although its placement objectives help signal paths meet their timing constraints, such a placement tool does not directly consider timing constraints when placing cells. Since a computer can require much processing time to develop a detailed routing plan, one way to reduce the time required for the placement and routing process to converge on an acceptable layout is to employ a placement algorithm that takes timing constraints into account when producing a placement plan so that a routing tool will be more likely to produce a routing plan satisfying all timing constraints.

In one common approach for considering timing constraints when generating a layout, a designer first creates a timing budget allocating a separate portion of the timing constraint on each time-constrained signal path to each net included in that signal path. The designer then assigns a weight to each net indicating a priority that the placement algorithm is to place on keeping cells connected to that net near one another. When tightly constrained nets are given more weight, the placement algorithm will be biased toward keeping cells connected to the most tightly constrained nets close to one another. This approach addresses the timing closure problem in an indirect way by loosely transforming the timing closure problem into the problem of assigning net weights. But designers often find it difficult to determine how to allocate a signal path's timing constraint among the nets forming a signal path and to select an appropriate weight for each net. Allocating too large a portion of a time constraint to a net causes a placement algorithm to try to place cells connected to that net closer together than necessary and makes it more difficult for the algorithm to meet constraints on other nets. Assigning too little weight to a net can allow a placement algorithm to place cells connected to that net too far apart to meet timing constraints on signal paths including that net.

The invention relates to a method for determining how to modify a placement plan so that when a routing tool develops a detailed routing plan based on that placement plan, the resulting layout will be more likely to satisfying timing constraints on all signal paths.

SUMMARY OF THE INVENTION

In accordance with a preferred embodiment of the invention, when an IC layout is to include time-constrained signal paths, a placement plan defining positions of cells forming the IC is analyzed to estimate lengths of nets needed to interconnect the cells based on the positions of cells included in those signal paths. A capacitance and resistance of each net is then estimated based on its estimated length. The delay through each time-constrained signal path is then estimated based on the estimated capacitance and resistance of each net to be included in the time-constrained signal path and on the terminal impedances, switching speeds and driving strengths of the cells included in the signal path. The estimated path delay for each signal path is then compared to its timing constraint to determine whether that signal path is a "critical signal path" that could fail to meet its timing constraint following development of a detailed routing plan. A non-linear programming problem is then set up and solved to determine how, with minimal disturbance to the placement plan, to reposition cells forming the critical paths so that when the nets are routed between the cells, all critical paths will be more likely to satisfy their timing constraints.

The solution to the non-linear programming problem is a value for a vector x, a vector representing the positions of each cell included in the identified critical paths that minimizes a function f(x) subject to the constraints $$c_i(x) \geq 0, i=1, 2 \ldots N$$

The function f(x) is a measure of the change in the placement plan when the placement plan is changed to move cells included in the identified critical paths to positions specified by x. f(x) can be formulated in various ways, such as for example, $$f(x) = |x - x_0|^2 = \sum_j |x^{(j)} - x_0^{(j)}|^2$$

where $|x^{(j)} - x_o^{(j)}|^2$ is the square of the Euclidean distance between the original position of cell j and its ending position. The Euclidean distance between two points is the shortest (straight line) distance between the two points.

The function $c_i(x)$ has a value larger than 0 when x is such that an estimated delay of the $i^{th}$ critical path is less than a maximum allowable delay permitted by that critical path's timing constraint. The function $c_i(x)$ can be calculated in various ways such as, for example, $$c_i(x) = d_i - \sum_{k=1}^{n_i} d_k^{(i)} * |net_k^{(i)}(x)|$$

where $d_k^{(i)}$ is a constant representing an estimated delay per unit length of $net_k^{(i)}$ and is inversely proportional to the driving strength of the cell driving that net, $$d_i = \text{estimated\_net\_delay}^{(P_i)} + \text{slack}^{(P_i)}$$

$\text{slack}^{(P_i)}$ is an amount by which the maximum allowable delay of the $i^{th}$ critical path exceeds the path delay of that critical path estimated at step c, estimated_net_delay$^{(P_i)}$ is equal to the total path delay of path Pi estimated at step c due to the capacitance of wires connecting the cells included in the path, and $|net_k^{(i)}(x)|$ is a function of x and is an estimated length of the $k^{th}$ net of the $i^{th}$ critical path when cells of all critical paths are positioned as indicated by vector x.

When we modify the placement plan in accordance with the solution to the above-described non-linear programming problem, a routing tool will be more likely to produce a routing plan satisfying all timing constraints.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to a method for optimizing an integrated circuit (IC) placement plan to improve the likelihood that a routing plan based on the placement plan will satisfy signal path timing constraints and to software stored on computer-readable media for enabling a conventional computer to implement that method. Suitable computer-readable media for storing the software include, but are not limited to, compact disks, floppy disks, hard disks, and random access or read only memory. While the specification describes at least one exemplary embodiment of the invention considered a best mode of practicing the invention, the invention is not limited to the particular example(s) described below or to the manner in which they operate.

An IC designer typically produces a high-level language, register transfer level (RTL) netlist describing a digital IC mainly in terms of the logic the IC is to implement. The designer then uses computer-aided synthesis tools to convert the HDL netlist into a gate level netlist describing the IC as a set of interconnected cells (such as logic gates and other devices) for performing the logic and other functions described by the RTL netlist. The designer next uses a placement tool to develop a placement plan indicating where each cell is to reside within an IC layout and then uses a routing tool to develop a routing plan indicating how various conductive networks ("nets") for conveying signals between the cells are to be routed between cell terminals. The placement and routing plans form an IC layout for guiding IC fabrication.

Figure 1:
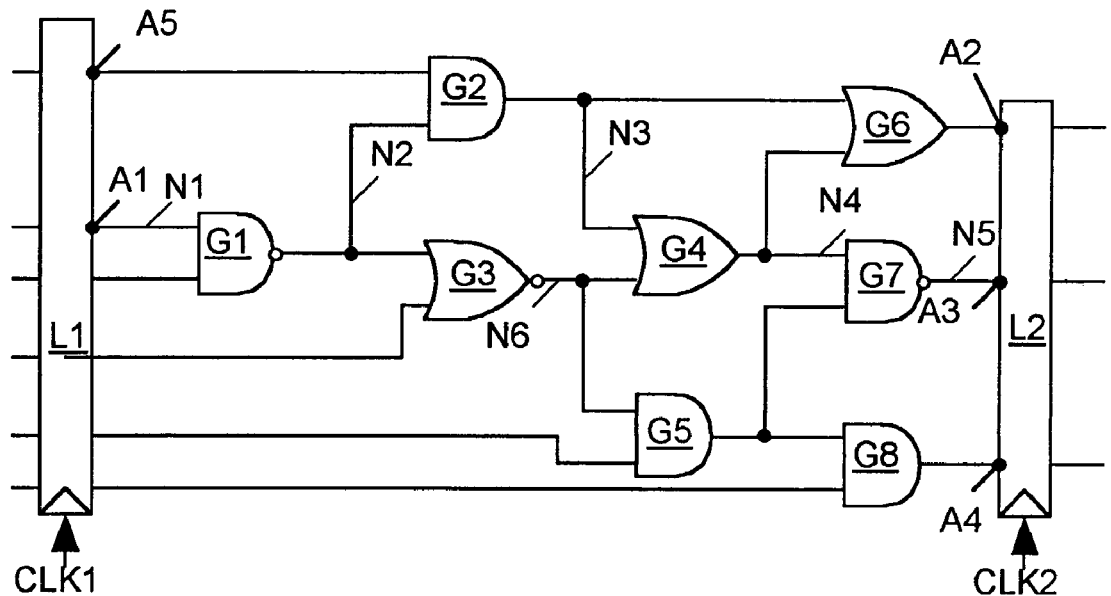
FIG. 1 depicts a block of synchronous logic as might be included in a prior art integrated circuit.

The invention relates to a method for modifying the placement plan to reduce the likelihood that a routing tool will be unable to develop a routing plan satisfying timing constraints on all signal paths. A "signal path" within an integrated circuit (IC) is a set of conductors and/or logic gates logically interconnecting two nodes. For example, FIG. 1 illustrates a block of logic formed by a set of gate G1–G8 residing between two latches L1 and L2 clocked by separate clock signals CLK1 and CLK2 of similar frequency but of differing phase. The circuit of FIG. 1 provides many signal paths between outputs of latch L1 and inputs of latch L2. One such signal path extends between latch L1 output A1 and latch L2 input A2 and includes the following gates and interconnecting nets:

Net N1,
Gate G1,
Net N2,
Gate G2,
Net N3,
Gate G4,
Net N4,
Gate G7, and
Net N5

Typically the designer will want the path delay between the outputs of latch L1 and the inputs of latch L2 to be less than the period between edges of clock signals CLK1 and CLK2 so that after a CLK1 signal edge allows signals at the outputs of latch L1 to change state, the inputs of latch L2 will settle to steady-state values before the next CLK2 signal edge. The designer will therefore want to place a timing constraint of T nsec on every signal path between any output of latch L1 and any input of latch L2 where T is a period that is suitably less than the period between CLK1 and CLK2 edges.

Figure 2:
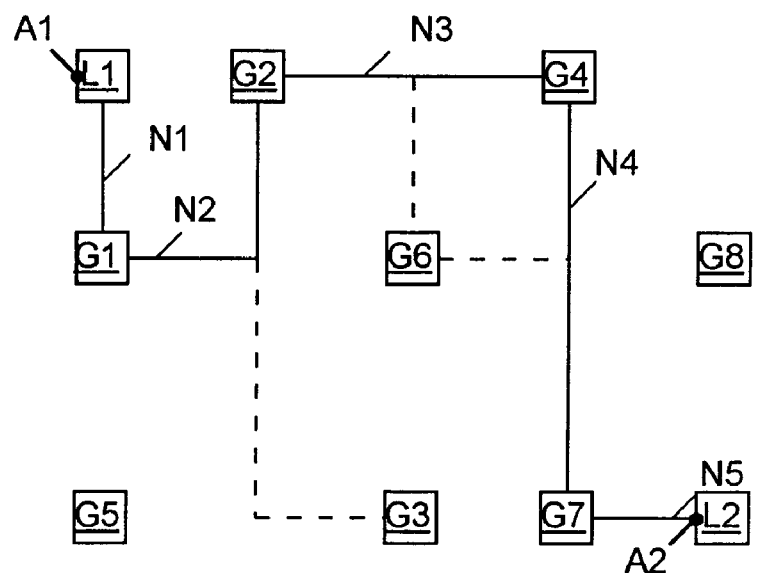
FIG. 2 is a simplified plan view of a portion of an IC illustrating how a placement tool might position the latches and gates of FIG. 1 within the IC.

FIG. 2 is a simplified plan view of a portion of an IC illustrating how a placement tool might position latches L1 and L2 and gates G1–G8 of FIG. 1 and how a routing tool might route nets N1–N5 forming the signal path between nodes A1 and A2. Although nets normally consist of conductors formed on several layers of the IC with vias extending vertically between the conductors, the simplified view of FIG. 2 does not depict nets N1–N5 in such detail.

The total delay through the signal path between nodes A1 and A2 is the sum TG of the switching delays through latch L1 and gates G1, G2, G4 and G7 forming the path and the sum TN of the propagation delays through the nets N1–N5 forming the path. The propagation delay TN is usually much smaller than the switching delay TG. As a result, the switching delay TG dominates the total delay of signal paths in most of cases.

The switching delay TG of a gate is largely a function of the series resistance and shunt capacitance of its output net, of the capacitances of gate terminals connected to its output net and of the driving strength (the ability to supply charging current) of the gate. The input capacitances of gate terminals and the driving strength of each gate can be determined from cell library entries describing the gates. The series resistance and shunt capacitance of conductors forming a net are increasing functions of their lengths. For example, a signal edge passing over net N2 from gate G1 to G2 will have to charge the capacitance of the conductors forming net N2 and the input capacitances of the gates G2 and G3 connected to net N2 before it will be able to change its state at the input of gate G2. Thus, the switching delay of the gate G1 is largely a function of the wire length of the net N2 connecting gates G1, G2 and G3, and the input capacitances of the gate G2 and G3 connected to net N2 and of the driving strength of gate G1.

After establishing placement and routing plans for an IC, a designer typically uses conventional resistance/capacitance (RC) extraction tools to process the routing plan to determine the resistance and capacitance of conductors forming each net and then uses a timing analysis tool to estimate the switching delay of gates through each time-constrained signal path based on the resistance and capacitance of each conductor forming the signal path, the capacitance of each cell terminal connected to any such conductor, the driving strength of the cell driving each net in the signal path, and the total propagation delay TN. This enables the designer to determine whether each signal path will meet its timing constraint. When a routing plan shows that a signal path fails to meet its timing constraint, the designer may alter the placement and routing plans to reduce delays through signal paths that fail to meet their timing constraints. An IC layout process can undergo many such timing analysis and layout modification iterations before converging on an IC layout satisfying all timing constraints.

Placement Plan Timing Optimization

A placement and routing tool typically requires much more time to develop a routing plan than a placement plan. In accordance with the invention we modify a placement plan before developing a detailed routing plan to improve the likelihood that all signal paths will meet their timing constraints. Since at that point we have not yet developed the detailed routing plan, we are not able to accurately estimate the resistance and capacitance of the conductors forming the nets and therefore are not able to predict path delays with as high accuracy as is possible following development of the routing plan. But we are able to make a rough estimate of the length of each net to be included in each time-constrained signal path based on positions of cells the net must interconnect. From this rough estimate we are able to estimate net capacitance and resistance and then employ a timing analysis tool to estimate the delay through each time-constrained signal path. We then compare the estimated path delay for each signal path to its timing constraint to determine whether that signal path is a "critical signal path" likely to fail to meet its timing constraint following development of a detailed routing plan. After identifying all such "critical signal paths", we employ a non-linear programming technique to quickly determine how to modify the placement plan to reposition cells forming those critical paths so that a routing tool will be more likely to generate a detailed routing plan satisfying all timing constraints. The invention speeds up the layout process by reducing the number of iterative placement and routing plan modifications needed to converge on a layout satisfying all timing constraints.

Figure 3:
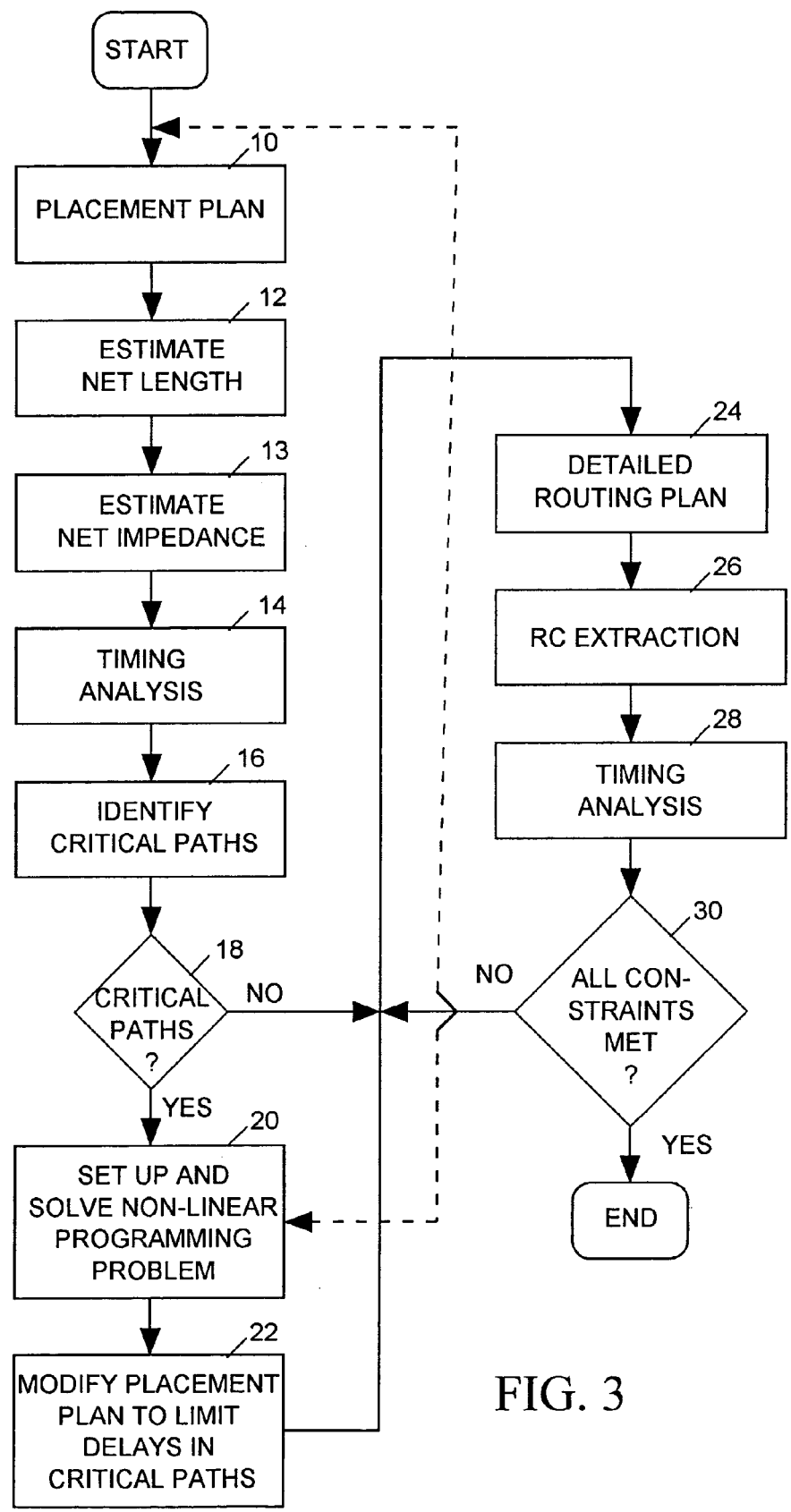
FIG. 3 is a flow chart depicting an IC layout process in accordance with an exemplary embodiment of the invention.

FIG. 3 is a flow chart depicting an IC layout process in accordance with the invention. After generating a placement plan using a conventional placement tool (step 10), we roughly estimate a "length" of each net to be included in a time-constrained path based on the positions of cells connected to it (step 12). Since a routing plan does not yet exist, we do not at that point know the exact route each net is to follow. But since a typical routing tool will attempt to find the shortest route possible for each net, it is sufficient for purposes of estimating path delays through each net to assume that each net will follow the shortest possible path between the gates it interconnects. In a typical IC layout each conductor included in a net can extend only in one of two orthogonal (X,Y) directions on the various layers of the IC. Thus the shortest distance a net can travel between a signal driving gate and a signal receiving gate is the "Manhattan distance" between the two gates. The Manhattan distance between two points $p_1$ and $p_2$ on a plane is the sum of distances between the two points measured along orthogonal X and Y axes of the plane. Thus in a plane with $p_1$ at $(x_1, y_1)$ and $p_2$ at $(x_2, Y_2)$, the Manhattan distance is $|x_1-x_2|+|y_1-Y_2|$.

The "bounding box" of a net is the smallest rectangular area of the layout containing all of the cells interconnected by the net. A good estimate of net length is given by the length of the bounding box of the net multiplied by a constant, i.e., $$c*(|x_{max}-x_{min}|+|y_{max}-y_{min}|) \quad [1]$$

where $x_{max}$ and $x_{min}$ ($y_{max}$ and $y_{min}$) are respectively the maximum and the minimum x (y) coordinates of cells on the net; c is a constant indicating the ratio between the real wire length and the length of the bounding box, which depends on the total number of cells on the net and is usually obtained from the statistics of net distribution in IC layout.

After estimating the net's length, we estimate its resistive and capacitive impedance based on an estimated average capacitance and resistance per unit of net length (step 13). We then employ a timing analysis tool (step 14) to estimate the propagation delay of signal paths and the switching delay of gates through each time-constrained path based on the estimated resistance and capacitance of each net included in the signal path, on the capacitance of each cell terminal connected to the net, and driving strength of each cell in the signal path. When the estimated delay through a signal path exceeds its timing constraint, we identify that signal path as a "critical path" likely to fail to meet its timing constraints and include in a pool of such critical paths (step 16). If one or more critical paths are included in the path pool (step 18), we set up and solve a non-linear programming problem (step 20) to determine how best to reposition cells to reduce the delays through the critical paths, and then modify the placement plan accordingly (step 22). After step 22, or after step 18 if we have not identified any critical paths, we employ a routing tool to develop a detailed routing plan specifying a route for each net of the IC (step 24). A conventional RC extraction tool next processes the routing plan to estimate resistances and capacitances of all conductors forming nets in the routing plan (step 26). A conventional timing analysis tool then estimates the path delay through each time-constrained path based on the estimated resistances and capacitances of net conductors, on the capacitances of cell terminals connected to the net conductors, and on the propagation delays of the nets on the path (step 27).

We then compare the estimated delay through each time-constrained signal path to its timing constraint and whether the layout meets all other constraints (step 30). The layout process ends following step 30 when the layout meets all constraints. When we determine at step 30 that one or more signal path fails to meet its timing constraint, then we take steps to reduce its path delay. The first approach is to return to step 24 to modify the routing plan, for example by re-routing nets to make them shorter, or by inserting buffers into nets to reduce their path delays. We then repeat steps 26, 28 and 30 to determine whether all signal paths now meet their timing constraints. If any signal path still fails to meet its timing constraint (step 30), we can return to steps 20 and 22 to revise the placement plan to reduce delays in the critical paths. In this pass through steps 20 and 22, the critical paths will have been identified at step 30 based on RC extraction data obtained from the detailed routing plan. Alternatively, we can return to step 10 to generate a new placement plan.

Use of Trial Routing Plan to Estimate Net Lengths and Path Impedances

Referring to step 12 of FIG. 3, we estimate the lengths of the nets forming time-constrained paths based only on the bounding boxes of the nets. We then (step 13) estimate the resistances and capacitances of the nets based on their estimated lengths.

Figure 4:
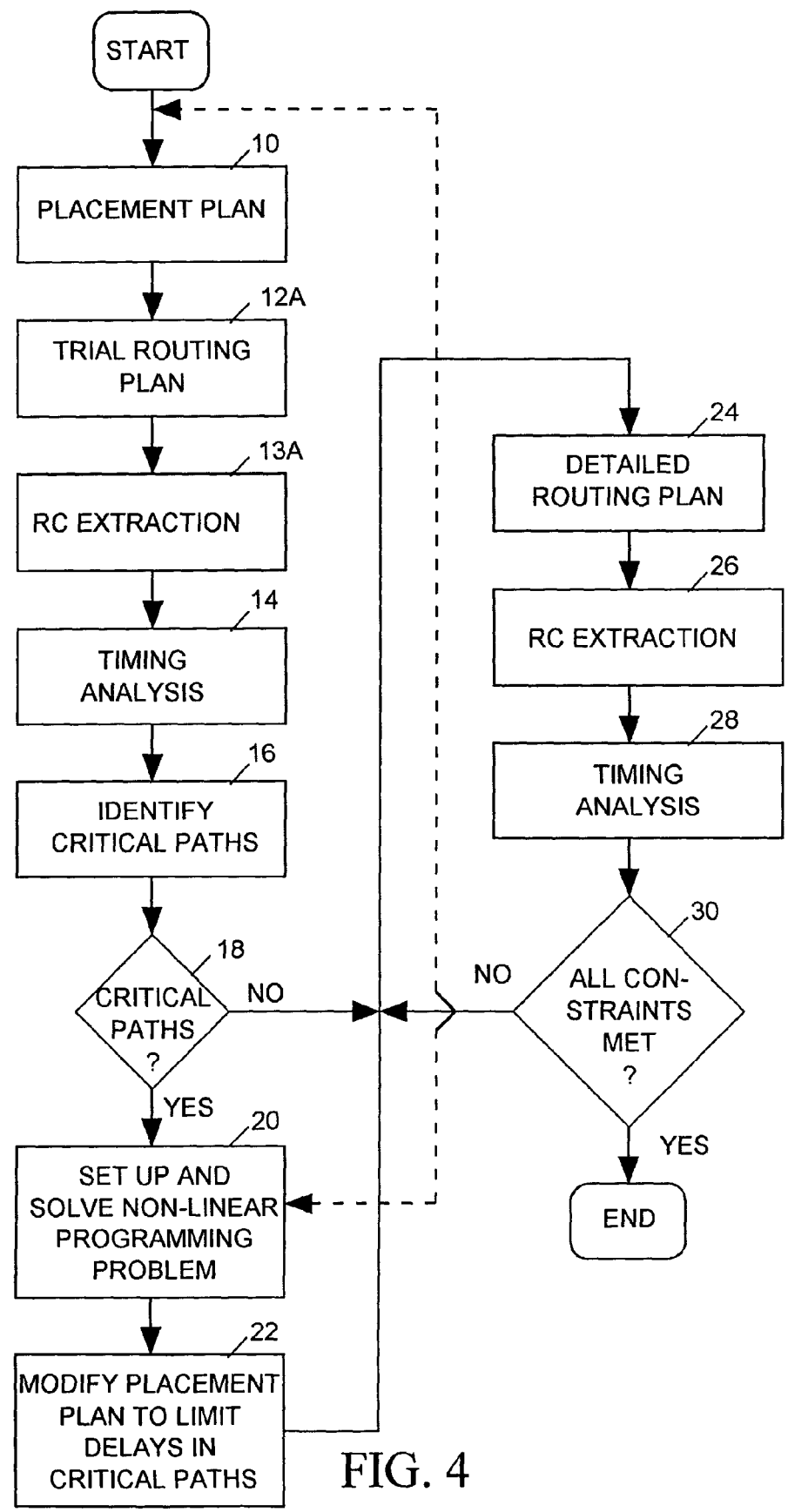
FIG. 4 is a flow chart depicting an IC layout process in accordance with an alternative embodiment of the invention.

FIG. 4 illustrates an IC layout process in accordance with an alternative embodiment of the invention generally similar to that of FIG. 3 except for the manner in which we estimate net impedances. After generating a placement plan at step 10, we employ a routing tool to develop a trial routing plan at step 12A in the same way it develops a detailed routing plan at step 24, but in developing a trial routing plan we allow the tool to stop processing the routing plan before it has resolved all routing conflicts. A typical routing tool will establish a preliminary route for each net and will then iteratively modify the routing plan to reroute nets as necessary to eliminate routing conflicts. Typically, a routing tool spends most of its time on resolving routing conflicts, and since it need not resolve all routing conflicts in creating a "trial" routing plan at step 12A, a conventional routing tool can create a trial routing plan quickly. Although the routing tool would likely modify many of the nets if allowed to resolve all routing conflicts, it typically makes only small changes to nets in order to resolve routing conflicts. Thus the impedance of each net before routing conflicts are resolved is likely to be a relatively good predictor of the impedance of that net after routing conflicts are resolved.

After creating a trial routing plan at step 12A, we employ an RC extraction tool to process the trial routing plan to determine the resistance and capacitance of each net conductor (step 13A) supplied as input for timing analysis at step 14. The remaining portions of the process of FIG. 4 are similar to those of the process of FIG. 3. The method of FIG. 4 can be advantageous over that of FIG. 3 because it more accurately identifies critical paths.

Identifying Critical Paths

Referring to step 16 of FIG. 3 or 4, we define the set of critical paths in the path pool as $$\{P_i | i=1, 2, \ldots N\}$$

where each path ($P_i$) includes a set $n_i$ nets $$net_k^{(i)} \text{ for } k=1, 2 \ldots n_i$$

We order the critical paths in the pool by index (i) such that for each path ($P_i$)

$$slack^{(P_i)} \leq slack^{P_{(i+1)}}$$

for all i from 1 through N−1.

The quantity $$slack^{(P_i)}$$

is the "slack" of the path $P_i$ defined by $$slack^{(P_i)} = constraint^{P_i} - estimated\_delay^{(P_i)}$$

The parameter $$estimated\_delay^{(P_i)}$$

for path $P_i$ is the delay through the path estimated during the timing analysis step 14 including the estimated switching delay through all of the gates included in the path and the estimated propagation delays through the nets included in the path. The quantity $$constraint^{(P_i)}$$

is the path's timing constraint.

Thus the slack of a path is the amount by which the path's timing constraint exceeds its estimated path delay and whenever $$slack^{(P_i)} > 0$$

the path $P_i$ is likely to meet its timing constraint. Although we could exclude paths from the path pool for which $$slack^{(P_i)} > 0$$

it is preferable to instead set a somewhat higher upper bound ("slack margin") λ on the slack of each path to provide for a margin of error in the path delay estimates. Thus the paths included in the critical path pool satisfy the following:

$$slack^{(P_i)} \leq \lambda$$

for all i=1, 2 . . . N where slack margin λ is a positive number.

We therefore exclude paths for which estimated slack is greater than the slack margin from the path pool. Also we further limit membership in the path pool by requiring that any path $P_i$ should not be a subset of the union of $P_k$ for all k<i. This means that when all the nets and gates forming a particular path are included in other signal paths having less slack than the particular path, then we exclude that particular path from the critical path pool. The assumption behind this rule is that when all parts of a particular signal path are included in other paths having less slack, then by repositioning the cells of the other paths to decrease the delay through those paths, we also decrease the delay through the particular signal path.

Non-Linear Programming Problem

Referring to step 20 of FIG. 3 or 4, we set up and solve a non-linear programming problem to determine how to reposition the cells connected to nets forming the paths in the critical path pool. Given a pool of critical paths $P_i$ $$\{P_i | i=1, 2, \ldots N\}$$

where each path ($P_i$) consists of nets $$net_k^{(i)} \text{ for } k=1, 2 \ldots n_i$$

we formulate an inequality constraint relative to each critical path:

$$c_i(x) \geq 0, i=1, 2 \ldots N \quad [2]$$

where $$c_i(x) = d_i - \sum_{k=1}^{n_i} d_k^{(i)} * |net_k^{(i)}(x)|$$

$d_k^{(i)}$ is a constant representing an estimated delay per unit length of $net_k^{(i)}$ and is inversely proportional to the driving strength of the cell driving that net;

$$d_i = estimated\_net\_delay^{(P_i)} + slack^{(P_i)}$$

is an upper bound on the sum of estimated delays through the nets forming path $P_i$ for which the path will satisfy its timing constraint, $$estimated\_net\_delay^{(P_i)}$$

is equal to the total path delay estimated at step 14 due to the capacitance of wires (conductors) connecting the cells included in the path, and $|net_k^{(i)}(x)|$ is the estimated "wire length" of the $k^{th}$ net of the $i^{th}$ signal path. Even though equation [1] provides a good wire length estimate, it is not differentiable in x, and is therefore not suitable for numerical analysis purposes. We therefore approximate $|net_k^{(i)}(x)|$ by the square root of a weighted sum of squares of Euclidean distances between the cells on the net. Suppose a net has n instances with coordinates ($x_i$, $y_i$), 1<=i<=n. Then we can approximate $|net_k^{(i)}(x)|$ as $$|net_k^{(i)}(x)| = \left( \sum_i \sum_j c * ((x_i - x_j)^2 + (y_i - y_j)^2) \right)^{1/2}$$

for i<j, where c=6/(n*(n+1)).

The vector x indicates the position of every cell included in a critical path. We assign each possible (X,Y) position for a cell within an IC layout a separate value of a variable x and we identify the position of each $k^{th}$ cell of each $i^{th}$ critical path by a separate variable $x^{(j)}$. Thus assuming the critical paths include a total of J cells, the original positions of all cells of all critical paths can be identified by a constant vector $$x_0 = [x_0^{(1)}, x_0^{(2)}, \ldots x_0^{(J)}]$$

and the positions to which we move these cells to reduce path delays are defined by a variable vector $$x = [x^{(1)}, x^{(2)}, \ldots x^{(J)}]$$

We would like, at step 22 of FIG. 3 or 4, to reposition the cells included in each critical path $P_i$ to satisfy the set of inequality constraints described in equation [2]. This will increase the likelihood that path delays of all critical paths will be within their timing constraints after a routing tool has created the detailed routing plan at step 24 of FIG. 3. But since the cells included in critical paths may also be included in paths that are not critical, we want to minimize the distance we move those cells to minimize the likelihood that relocating a cell increases the path delay in a non-critical path to a point where it becomes a critical path. For example, referring to FIG. 1, if the path A1 to A3 is critical but the path A5 to A2 is not critical, then when we reposition gate G2 to reduce the delay of path A1–A3, it is possible that we could increase the A5–A2 path delay to a point where that path fails to meet its timing constraint. Thus when reducing the A1–A3 path delay to a point where it is likely to meet its timing constraint, we do not want to move gate G2 or any other gate included in that path any more than necessary.

We therefore quantify the disturbance to the placement plan caused by repositioning of cells included in the critical paths as a function of x:

$$f(x) = |x - x_0|^2 = \sum_j |x^{(j)} - x_o^{(j)}|^2$$

where $|x^{(j)} - x_o^{(j)}|^2$ is the square of the Euclidean distance between the original position of cell j and its ending position. Thus the non-linear programming problem to solve it is:

minimize f(x)

subject to the inequality constraints described in equation [2] above $c_i(x) \geq 0, i=1, 2 \ldots N$ Any of several methods known to those of skill in the art can be employed at step 20 to solve this type of problem. Several such methods are described at pages 277–295 of the book "Practical Methods of Optimization" by R. Fletcher, published March 1991 by John Wiley & Sons, incorporated herein by reference.

Placement Plan Modification

We modify the placement plan at step 22 of FIG. 3 or 4 to reposition cells in accordance with the solution to the non-linear programming problem described above. The solution places each cell included in a critical path at a position that minimizes the disturbance to the placement plan, but it is still very likely that the solution will result in a placement plan with cells overlapping with each other. It is therefore necessary at step 22 to resolve any placement conflicts by further modifying the plan to eliminate cell overlaps preferably in a manner that minimizes the distance any one cell is moved. One suitable method for doing this is described in U.S. patent application Ser. No. 10/225,255 entitled "Quadratic Programming Method For Eliminating Cell Overlap And Routing Congestion In An IC Layout" filed by Ywh-Pyng Harn on Aug. 20, 2002 and incorporated herein by reference.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for generating an integrated circuit (IC) layout for an IC that is to include cells interconnected by nets to form signal paths, wherein some of the signal paths are time-constrained signal paths, wherein each time-constrained signal path is subject to a timing constraint limiting a delay through that signal path to not exceed a specified maximum allowable delay, the method comprising:
 a. generating a placement plan specifying initial positions of the cells within the layout prior to generating a routing plan,
 b. processing the placement plan to estimate a length of each net to be included in the time-constrained signal paths based on the specified initial positions of cells that the net is to interconnect,
 c. estimating a path delay through each time-constrained signal path based at least in part on the length of each net included in the time-constrained signal path estimated at step b,
 d. identifying each time-constrained signal path as a critical path when a difference between its maximum allowable path delay and its path delay estimated at step c is less than a predetermined slack margin λ, and
 e. determining how to modify the placement plan so that it specifies new positions within the layout for cells included in each identified critical path, with the new positions being selected to reduce the path delays through the critical paths.

2. The method in accordance with claim 1 wherein at step b, the length of each net to be included in the time-constrained signal paths is estimated based on dimensions of a smallest rectangular area of the IC layout containing all cells to be interconnected by the net.

3. The method in accordance with claim 1 wherein step c comprises the substeps of:
 c1. estimating an impedance of each net included in each time-constrained signal path as a function of its estimated length, and
 c2. estimating the path delay through each time-constrained signal path as a function of it estimated impedance.

4. The method in accordance with claim 3
 wherein λ>0,
 wherein step e comprises the substeps of so lying the following non-linear programming problem for x, a vector representing the new positions of each cell included in the identified critical paths:

minimize f(x)

subject to the constraints $c_i(x) \geq 0, i=1, 2 \ldots N,$ wherein f(x) is a function of x quantifying a change in the placement plan when the placement plan is changed to move cells included in the identified critical paths to positions specified by x, and wherein for each $i^{th}$ critical path $$c_i(x) = d_i - \sum_{k=1}^{n_i} d_k^{(i)} * |net_k^{(i)}(x)|$$

wherein $d_k^{(i)}$ is a constant representing an estimated delay per unit length of $net_k^{(i)}$ and is inversely proportional to the driving strength of the cell driving that net, wherein $$d_i = \text{estimated\_net\_delay}^{(Pi)} + \text{slack}^{(Pi)}$$

wherein $$\text{slack}^{(Pi)}$$

is an amount by which the maximum allowable delay of the $i^{th}$ critical path exceeds the path delay of that critical path estimated at step c,
wherein $$\text{estimated\_net\_delay}^{(Pi)}$$

is equal to the total path delay of path Pi estimated at step c due to capacitance of portions of nets included in the path, and
wherein $|\text{net}_k^{(i)}(X)|$ is computed as the square root of a weighted sum of squares of Euclidean distances between cells connected to the $k^{th}$ net when cells are positioned as indicated by x.

5. The method in accordance with claim 4 further comprising the steps of:
   f. modifying the placement plan as determined in step e, and
   g. processing the placement plan to generate a detailed routing plan specifying how each net of the IC is to be routed within the IC layout.

6. The method in accordance with claim 1 wherein λ>0.

7. The method in accordance with claim 1 wherein step e comprises the substeps of solving the following non-linear programming problem for x, a vector representing the new positions of each cell included in the identified critical paths:

minimize f(x)

subject to the constraints, $$c_i(x) \geq 0, \ i=1,2 \ldots N,$$

wherein f(x) is a function of x quantifying a change in the placement plan when the placement plan is changed to move cells included in the identified critical paths to positions specified by x, and
wherein for each $i^{th}$ critical path $P_i$, $c_i(x)$ is a function x having a value larger than 0 when x is such that an estimated delay of the $i^{th}$ critical path is less than a maximum allowable delay permitted by that critical path's timing constraint.

8. The method in accordance with claim 7 wherein for each $i^{th}$ critical path $P_i$, $$c_i(x) = d_i - \sum_{k=1}^{n_i} d_k^{(i)} * |\text{net}_k^{(i)}(x)|$$

wherein $d_k^{(i)}$ is a constant representing an estimated delay per unit length of $\text{net}_k^{(i)}$ and is inversely proportional to the driving strength of the cell driving that net,
wherein $$d_i = \text{estimated\_net\_delay}^{(Pi)} + \text{slack}^{(Pi)}$$

wherein $$\text{slack}^{(Pi)}$$

is an amount by which the maximum allowable delay of the $i^{th}$ critical path exceeds the path delay of that critical path estimated at step c,
wherein $$\text{estimated\_net\_delay}^{(Pi)}$$

is equal to the total path delay of path Pi estimated at step c due to capacitance of portions of nets included in the path, and
wherein $|\text{net}_k^{(i)}(x)|$ is an estimated length of the $k^{th}$ net of the $i^{th}$ critical path when cells of all critical paths are positioned as indicated by the vector x.

9. The method in accordance with claim 8 wherein $|\text{net}_k^{(i)}(x)|$ is computed as the square root of a weighted sum of squares of Euclidean distances between cells connected to the $k^{th}$ net when cells are positioned as indicated by x.

10. The method in accordance with claim 1 further comprising the steps of:
    f. modifying the placement plan as determined in step e, and
    g. processing the placement plan to generate a detailed routing plan specifying how each net of the IC is to be routed within the IC layout.

11. A method for generating an integrated circuit (IC) layout for an IC that is to include cells interconnected by nets to form signal paths, wherein some of the signal paths are time-constrained signal paths, wherein each time-constrained signal path is subject to a timing constraint limiting a delay through that signal path to not exceed a specified maximum allowable delay, the method comprising:
    a. generating a placement plan specifying initial positions of the cells within the layout,
    b. processing the placement plan to estimate a length of each net to be included in the time-constrained signal paths based on the specified initial positions of cells that the net is to interconnect,
    c. estimating a path delay through each time-constrained signal path based at least in part on the length of each net included in the time-constrained signal path estimated at step b,
    d. identifying each time-constrained signal path as a critical path when a difference between its maximum allowable path delay and its path delay estimated at step c is less than a predetermined slack margin λ, and
    e. determining how to modify the placement plan so that it specifies new positions within the layout for cells included in each identified critical path, with the new positions being selected to reduce the path delays through the critical paths;
    wherein at step b, the length of each net to be included in the time-constrained signal paths is estimated as a square root of a weighted sum of squares of Euclidean distances between the cells on the net such that for a net having n instances with coordinates $(x_i, y_i)$, for $1 \leq i \leq n$, $$|\text{net}_k^{(i)}(x)| = \left( \sum_i \sum_j c * ((x_i - x_j)^2 + (y_i - y_j)^2) \right)^{1/2}$$

for i<j, wherein c=6/(n*(n+1)).

12. A method for generating an integrated circuit (IC) layout for an IC that is to include cells interconnected by nets to form signal paths, wherein some of the signal paths are time-constrained signal paths, wherein each time-constrained signal path is subject to a timing constraint limiting a delay through that signal path to not exceed a specified maximum allowable delay, the method comprising:
    a. generating a placement plan specifying initial positions of the cells within the layout prior to generating a routing plan, b. processing the placement plan to generate a trial routing plan specifying a route for each net of the IC within the IC layout,
c. processing the trial routing plan to estimate impedances of the nets to be included in the time-constrained signal paths,
d. estimating a path delay through each time-constrained signal path based at least in part on the impedances estimated at step b,
e. identifying each time-constrained signal path as a critical path when a difference between its maximum allowable path delay and its path delay estimated at step c is less than a predetermined slack margin $\lambda$, and
f. determining how to modify the placement plan so that it specifies new positions within the layout for cells included in each identified critical path, with the new positions being selected to reduce the path delays through the critical paths.

13. The method in accordance with claim 12 wherein $\lambda>0$.

14. The method in accordance with claim 12 further comprising the steps of:
g. modifying the placement plan as determined in step f, and
h. processing the placement plan to generate a detailed routing plan specifying how each net of the IC is to be routed.

15. The method in accordance with claim 14 wherein $\lambda>0$.

16. A method for generating an integrated circuit (IC) layout for an IC that is to include cells interconnected by nets to form signal paths, wherein some of the signal paths are time-constrained signal paths, wherein each time-constrained signal path is subject to a timing constraint limiting a delay through that signal path to not exceed a specified maximum allowable delay, the method comprising:
a. generating a placement plan specifying initial positions of the cells within the layout,
b. processing the placement plan to generate a trial routing plan specifying a route for each net of the IC within the IC layout,
c. processing the trial routing plan to estimate impedances of the nets to be included in the time-constrained signal paths,
d. estimating a path delay through each time-constrained signal path based at least in part on the impedances estimated at step b,
e. identifying each time-constrained signal path as a critical path when a difference between its maximum allowable path delay and its path delay estimated at step c is less than a predetermined slack margin $\lambda$, and
f. determining how to modify the placement plan so that it specifies new positions within the layout for cells included in each identified critical path, with the new positions being selected to reduce the path delays through the critical paths;
wherein step f comprises the substeps of solving the following non-linear programming problem for x, a vector representing the new position of each cell included in the identified critical paths:

minimize f(x)

subject to the constraints $c_i(x) \geq 0$, $i=1, 2 \ldots N$, wherein f(x) is a function of x quantifying a change in the placement plan when the placement plan is changed to move cells included in the identified critical paths to positions specified by x, and wherein for each $i^{th}$ critical path $P_i$, the function $c_i(x)$ is a function of x having a value larger than 0 when x is such that an estimated delay of the $i^{th}$ critical path is less than a maximum allowable delay permitted by that critical path's timing constraint.

17. The method in accordance with claim 16 wherein $$c_i(x) = d_i - \sum_{k=1}^{n_i} d_k^{(i)} * |net_k^{(i)}(x)|$$

wherein $d_k^{(i)}$ is a constant representing an estimated delay per unit length of $net_k^{(i)}$ and is inversely proportional to the driving strength of the cell driving that net,
wherein $d_i = \text{estimated\_net\_delay}^{(P_i)} + \text{slack}^{(P_i)}$ wherein $\text{slack}^{(P_i)}$ is an amount by which the maximum allowable delay of the $i^{th}$ critical path exceeds the path delay of that critical path estimated at step d,
wherein $\text{estimated\_net\_delay}^{(P_i)}$ is equal to the total path delay of path Pi estimated at step c due to capacitance of portions of nets included in the path, and
wherein $|net_k^{(i)}(x)|$ is an estimated length of the $k^{th}$ net of the $i^{th}$ critical path when cells of all critical paths are positioned as indicated by the vector x.

18. The method in accordance with claim 17 wherein $|net_k^{(i)}(x)|$ is computed as the square root of a weighted sum of squares of Euclidean distances between cells connected to the $k^{th}$ net when cells are positioned as indicated by x.

19. Computer-readable media storing software which when read and executed by a computer causes the computer to carry out a method for processing a placement plan for an integrated circuit (IC) layout for an IC that is to include cells interconnected by nets to form signal paths, wherein some of the signal paths are time-constrained signal paths, wherein each time-constrained signal path is subject to a timing constraint limiting a delay through that signal path to not exceeding a specified maximum allowable delay, wherein the method comprises:
a. processing the placement plan to estimate length of the nets to be included in the time-constrained signal paths prior to generating a routing plan, with estimated length of each net being computed from the specified initial positions of cells that the net is to interconnect;
b. estimating a path delay through each time-constrained signal path based at least in part on the length of each net included in the time-constrained signal path estimated at step a;
c. identifying each time-constrained signal path as a critical path when a difference between its maximum allowable path delay and its path delay estimated at step b is less than a predetermined slack margin $\lambda$; and
d. determining how to modify the placement plan so that it specifies new positions within the layout for cells included in each identified critical path, with the new positions being selected to reduce the path delays through the critical paths.

20. The computer-readable media in accordance with claim 19 wherein at step a, the length of each net to be included in the time-constrained signal paths is estimated as a square root of a weighted sum of squares of Euclidean distances between the cells on the net such that for a net having n instances with coordinates $(x_i, y_i), 1<=i<=n,$ $$|net_k^{(i)}(x)| = \left(\sum_i \sum_j c*((x_i - x_j)^2 + (y_i - y_j)^2)\right)^{1/2}$$

for i<j, wherein c=6/(n*(n+1)).

21. The computer-readable media in accordance with claim 19 wherein at step a, the length of each net to be included in the time-constrained signal paths is estimated based on dimensions of a smallest rectangular area of the IC layout containing all cells to be interconnected by the net.

22. The computer-readable media in accordance with claim 19 wherein step b comprises the substeps of:
  b1. estimating an impedance of each net included in each time-constrained signal path as a function of its estimated length, and
  b2. estimating the path delay through each time-constrained signal path as a function of it estimated impedance.

23. The computer-readable media in accordance with claim 19 wherein λ >0.

24. The computer-readable media in accordance with claim 19 wherein step d comprises the substeps of solving the following non-linear programming problem for x, a vector representing the new positions of each cell included in the identified critical paths:

minimize f(x)

subject to the constraints $c_i(x) \geq 0, i=1, 2 \ldots N,$ wherein f(x) is a function of x quantifying a change in the placement plan when the placement plan is changed to move cells included in the identified critical paths to positions specified by x, and wherein for each $i^{th}$ critical path $c_i(x)$ is a function of x having a value larger than 0 when x is such that an estimated delay of the $i^{th}$ critical path is less than a maximum allowable delay permitted by that critical path's timing constraint.

25. The computer-readable media in accordance with claim 24 wherein for each $i^{th}$ critical path $P_i$, $$c_i(x) = d_i - \sum_{k=1}^{n_i} d_k^{(i)} * |net_k^{(i)}(x)|$$

wherein $d_k^{(i)}$ is a constant representing an estimated delay per unit length of $net_k^{(i)}$ and is inversely proportional to the driving strength of the cell driving that net, wherein $d_i$=estimated_net_delay$^{(P_i)}$ wherein slack$^{(P_i)}$ is an amount by which the maximum allowable delay of the $i^{th}$ critical path exceeds the path delay of that critical path estimated at step b, wherein estimated_net_delay$^{(P_i)}$ is equal to the total path delay of path Pi estimated at step c due to capacitance of portions of nets included in the path, and
  wherein $|net_k^{(i)}|$ is an estimated length of the $k^{th}$ net of the $i^{th}$ critical path when cells of all critical paths are positioned as indicated by vector x.

26. The computer-readable media in accordance with claim 25 wherein the method further comprises the steps of:
  e. modifying the placement plan as determined in step d, and
  f. processing the placement plan to generate a detailed routing plan specifying how each net of the IC is to be routed within the IC layout.

27. The computer-readable media in accordance with claim 26 wherein $|net_k^{(i)}(x)|$ is computed as the square root of a weighted sum of squares of Euclidean distances between cells to be interconnected by the $k^{th}$ net when cells are positioned as indicated by x.

28. The computer-readable media in accordance with claim 19 wherein the method further comprises the step of:
  e. modifying the placement plan as determined in step d, wherein λ>0,
  wherein step d comprises the substeps of solving the following non-linear programming problem for x, a vector representing the new positions of each cell included in the identified critical paths:

minimize f(x)

subject to the constraints $c_i(x) \geq 0, i=1, 2 \ldots N,$ wherein f(x) is a function of x quantifying a change in the placement plan when the placement plan is changed to move cells included in the identified critical paths to positions specified by x, and
wherein for each $i^{th}$ critical path $$c_i(x) = d_i - \sum_{k=1}^{n_i} d_k^{(i)} * |net_k^{(i)}(x)|$$

wherein $d_k^{(i)}$ is a constant representing an estimated delay per unit length of $net_k^{(i)}$ and is inversely proportional to the driving strength of the cell driving that net,
wherein $d_i$=estimated_net_delay$^{(P_i)}$=slack$^{(P_i)}$ wherein slack$^{(P_i)}$ is an amount by which the maximum allowable delay of the $i^{th}$ critical path exceeds the path delay of that critical path estimated at step c,
wherein estimated_net_delay$^{(P_i)}$ is equal to the total path delay of path Pi estimated at step b due to capacitance of portions of nets included in the path, and
  wherein $|net_k^{(i)}(x)|$ is computed as the square root of a weighted sum of squares of Euclidean distances between cells connected to the $k^{th}$ net when cells are positioned as indicated by x.

29. The computer-readable media in accordance with claim 19 wherein the method further comprises the steps of:
 e. modifying the placement plan as determined in step d, and
 f. processing the placement plan to generate a detailed routing plan specifying how each net of the IC is to be routed.

* * * * *